(12) United States Patent
Liu

(10) Patent No.: US 6,320,757 B1
(45) Date of Patent: Nov. 20, 2001

(54) ELECTRONIC PACKAGE

(75) Inventor: Sheng-Tsung Liu, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 09/614,684

(22) Filed: Jul. 12, 2000

(51) Int. Cl.⁷ ..................................................... H05K 7/02
(52) U.S. Cl. .................... 361/760; 361/734; 361/738; 361/777; 361/780; 361/782; 361/783; 257/691; 257/724; 257/784; 257/786
(58) Field of Search ............................. 361/734, 738, 361/760, 763, 767, 777, 780, 782, 783, 818; 257/668, 691, 723, 724, 784, 786

(56) References Cited

U.S. PATENT DOCUMENTS

| | | | |
|---|---|---|---|
| Re. 37,082 | * 3/2001 | Butera | 257/723 |
| 5,089,878 | * 2/1992 | Lee | 257/724 |
| 5,243,496 | * 9/1993 | Mermet-Guyennet | 361/783 |
| 5,483,099 | * 1/1996 | Natarajan | 257/691 |
| 5,539,254 | * 7/1996 | Eytcheson et al. | 257/691 |
| 5,629,840 | * 5/1997 | Hanburgen et al. | 257/691 |
| 5,719,748 | * 2/1998 | Cullinan et al. | 361/782 |
| 5,811,880 | 9/1998 | Banerjee et al. | 257/724 |
| 5,825,628 | 10/1998 | Garbelli et al. | 361/777 |
| 5,864,177 | * 1/1999 | Sundstrom | 257/724 |
| 5,877,942 | * 3/1999 | Kida et al. | 361/777 |
| 5,883,428 | 3/1999 | Kabumoto et al. | 257/691 |
| 5,889,325 | * 3/1999 | Uchida et al. | 257/724 |
| 5,923,085 | * 7/1999 | Donegan et al. | 257/724 |
| 5,925,925 | * 7/1999 | Dehaine et al. | 257/691 |
| 6,084,779 | * 7/2000 | Fang | 361/734 |
| 6,201,298 | * 3/2001 | Sato et al. | 257/691 |
| 6,239,367 | * 5/2001 | Hsuan et al. | 361/734 |

* cited by examiner

Primary Examiner—Jeffrey Gaffin
Assistant Examiner—John B. Vigushin

(57) ABSTRACT

An electronic package comprises a chip disposed on the upper surface of a substrate. The upper surface of the substrate is provided with a ground ring, a power ring, and a plurality of conductive traces arranged at the periphery of the ground ring and the power ring. The electronic package comprises at least a surface-mountable device connected across the ground ring and the power ring. The present invention is characterized in that the surface-mountable device has at least a bonding region formed on one end contact thereof for bonding to a bonding wire thereby allowing the chip to be electrically connected to the ground ring or power ring directly through the end contact of the surface-mountable device.

6 Claims, 2 Drawing Sheets

ELECTRONIC PACKAGE

BACKGROUND OF THE INVENTION

1. Field of the Invention

This invention generally relates to an electronic package, and more particularly to an electronic package using wire bonding technique wherein the electronic package comprises a chip disposed on a substrate having a ground ring, a power ring, and at least a surfacemountable device connected across the ground ring and the power ring.

2. Description of the Related Art

An electronic package typically includes a circuitized substrate with one or more active devices attached thereon; packages including only one device are known as Single Chip Modules (SCM), while packages including a plurality of devices are called Multi Chip Modules (MCM). The active device is typically a chip commonly made of Silicon, Germanium or Gallium Arsenide.

As the speed of semiconductor devices increase, noise in the DC power and ground lines increasingly becomes a problem. To reduce this noise, capacitors known as decoupling capacitors are often used to reduce power supply noise which occurs due to change in potential difference between the ground voltage and the power-supply voltage supplied to the active device. The decoupling capacitors are placed as close to the active device as practical to increase their effectiveness. Typically the decoupling capacitors are connected to power and ground as close as possible to the active device.

FIG. 1 shows a conventional BGA substrate 100 with a chip 110 securely attached to the metal paddle 102 on the upper surface of the substrate 100. The upper surface of the substrate 100 is provided with a ground ring 104, a power ring 106, and a plurality of conductive traces 108. The ground ring 104 is predetermined for coupling to a source of the ground reference voltage. The power ring 106 is predetermined for coupling to a source of the power reference voltage potential. In order to suppress the power supply noise described above, several decoupling capacitors 120 are connected across the ground ring 104 and the power ring 106. Typically, the decoupling capacitors 120 are surface-mountable devices (SMD's) used in the so-called surface-mounting technique in which the capacitors 120 are directly secured to the ground ring 104 and the power ring 106 via two end contacts thereof.

However, when these capacitors are on the substrate at the package level, they hinder the space available for the wire bonding. This is because it is generally preferred to avoid contact between the bonding wires and the capacitors. Therefore, the bonding wires 130 connected between the chip 110 and the ground ring 104 (or the power ring 106) at the periphery of the decoupling capacitors 120 must keep away from the decoupling capacitors 120 thereby increasing difficulties and risks of wire bonding.

SUMMARY OF THE INVENTION

It is a primary object of the present invention to provide an electronic package comprising a chip disposed on a substrate having a ground ring, a power ring, and at least a surface-mountable device connected across the ground ring and the power ring, wherein the electronic package is characterized in that the surface-mountable device has at least a bonding region formed on one end contact thereof for bonding to a bonding wire thereby allowing the chip to be electrically connected to the ground ring or power ring directly through the end contact of the surface-mountable device.

The electronic package according to a preferred embodiment of the present invention mainly comprises a chip disposed on the upper surface of a substrate. The upper surface of the substrate is provided with a ground ring, a power ring, and a plurality of conductive traces arranged at the periphery of the ground ring and the power ring. The electronic package comprises at least a surface-mountable device (such as a decoupling capacitor) connected across the ground ring and the power ring. The surface-mountable device comprises two end contacts and at least a bonding region formed on one of the end contacts. The electronic package comprises at least a bonding wire having one end connected to one of the bonding pads of the chip and the other end connected to the bonding region of the surface-mountable device such that the chip can be electrically connected to the ground ring or power ring directly through the end contact of the surface-mountable device. Since the bonding wires predetermined to be connected between the chip and the ground ring (or the power ring) at the periphery of the surface-mountable device don't have to keep away from the surfacemountable device, difficulties and risks of wire bonding for the electronic package of the present invention are significantly reduced.

BRIEF DESCRIPTION OF THE DRAWINGS

Other objects, advantages, and novel features of the invention will become more apparent from the following detailed description when taken in conjunction with the accompanying drawings.

DETAILED DESCRIPTION OF THE PREFERRED EMBODIMENT

Figure 3:
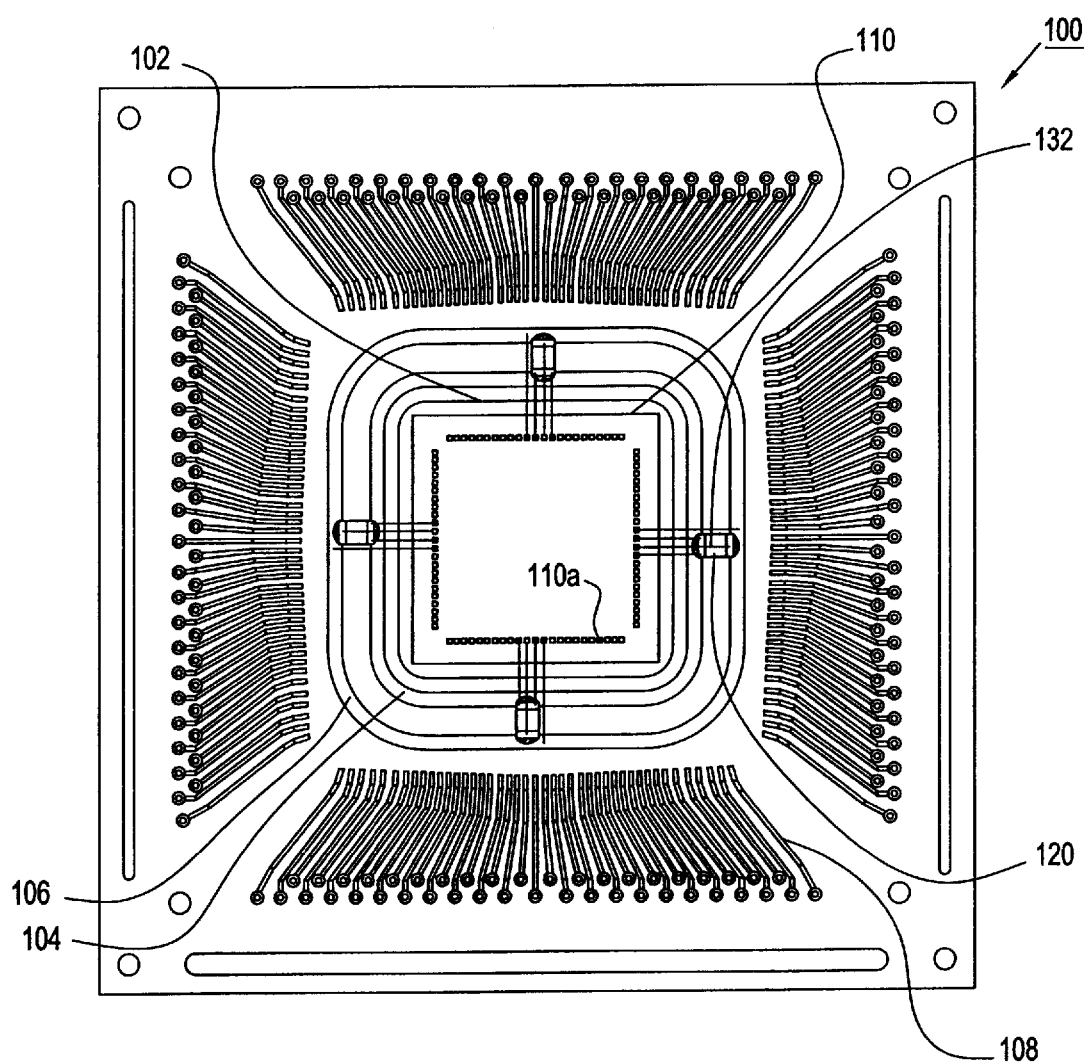
FIG. 3 is a top plan view of an electronic package according to a preferred embodiment of the present invention wherein the package body has been removed.

FIG. 3 shows an electronic package according to a preferred embodiment of the present invention. The electronic package mainly comprises a substrate 100 and a chip 110 securely attached to a metal paddle 102 disposed on the upper surface of the substrate 100. The upper surface of the substrate 100 is provided with a ground ring 104, a power ring 106, and a plurality of conductive traces 108. The ground ring 104 is predetermined for coupling to a source of the ground reference voltage such as a ground plane (not shown) formed in the substrate 100. The power ring 106 is predetermined for coupling to a source of the power reference voltage such as a power plane (not shown) formed in the substrate 100. Therefore, the source voltage and ground potential can be supplied in any desired positions through the ground plane and the power plane, so it is possible to shorten the source voltage or ground potential feed lines to suppress power source noises and attain speed-up of the operation of the chip. The electronic package of the present invention comprises at least a surface-mountable, device connected across the ground ring 104 and the power ring 106. The surface-mountable device can be a decoupling capacitors 120 in order to further suppress the power supply noise.

Figure 4:
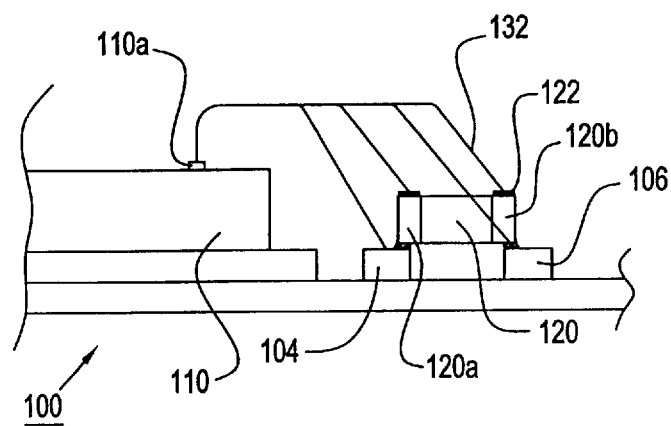
FIG. 4 is a cross sectional view of a portion of the electronic package of FIG. 3 in accordance with the present invention wherein the package body has been removed.

Referring to FIG. 4, the capacitor 120 typically comprises (a) a laminate of alternately stacked dielectric layers and metal layers and (b) two end contacts 120a, 120b. Each end contact comprises a sprayed-metal layer contacting one of two parallel side faces of the laminate and a metal cap electrically connected to the sprayed-metal layer and engaging the laminate in a clamping manner. The capacitor 120 is directly secured to the ground ring 104 and the power ring 106 via the end contacts 120a, 120b, respectively, using so-called surface-mounting technique. The electronic package of the present invention is characterized in that the decoupling capacitor 120 has at least a bonding region 122 formed on one of the end contacts 120a, 120b for bonding to a bonding wire. The bonding region 122 is preferably formed from gold or palladium, which bonds well with conventional bonding wire material. More preferably, the bonding region 122 comprises a layer of nickel covering the metal cap of the end contact, and a layer of gold or palladium covering the nickel layer. Most preferably, the bonding region 122 comprises a layer of nickel covering the metal cap of the end contact, a layer of palladium covering the nickel layer, and a layer of gold covering the palladium layer. It could be understood that the bonding region 122 is preferably formed. all over the metal cap of the end contact.

The electronic package of the present invention comprises at least a bonding wire 132 having one end connected to one of the bonding pads 110a of the chip 110 and the other end connected to the bonding region 122 of the decoupling capacitor 120. This allows the chip to be electrically connected to the ground ring 104 or power ring 106 directly through the end contact of the decoupling capacitor 120 (see FIG. 4).

It should be understood that the electronic package of the present invention further comprises a plurality of other bonding wires electrically connecting the bonding pads of the chip to the power ring 104, the ground ring 106 and corresponding conductive traces 108 of the substrate 100, respectively. The lower surface of the substrate 100 may be provided with a plurality of solder pads (not shown) electrically connected to the power ring 104, the ground ring 106 and corresponding conductive traces 108, respectively. Typically, each solder pad has a solder ball mounted thereon for making external electrical connection. The chip 110 and all bonding wires are encapsulated against a portion of the upper surface of the substrate 100.

Figure 1:
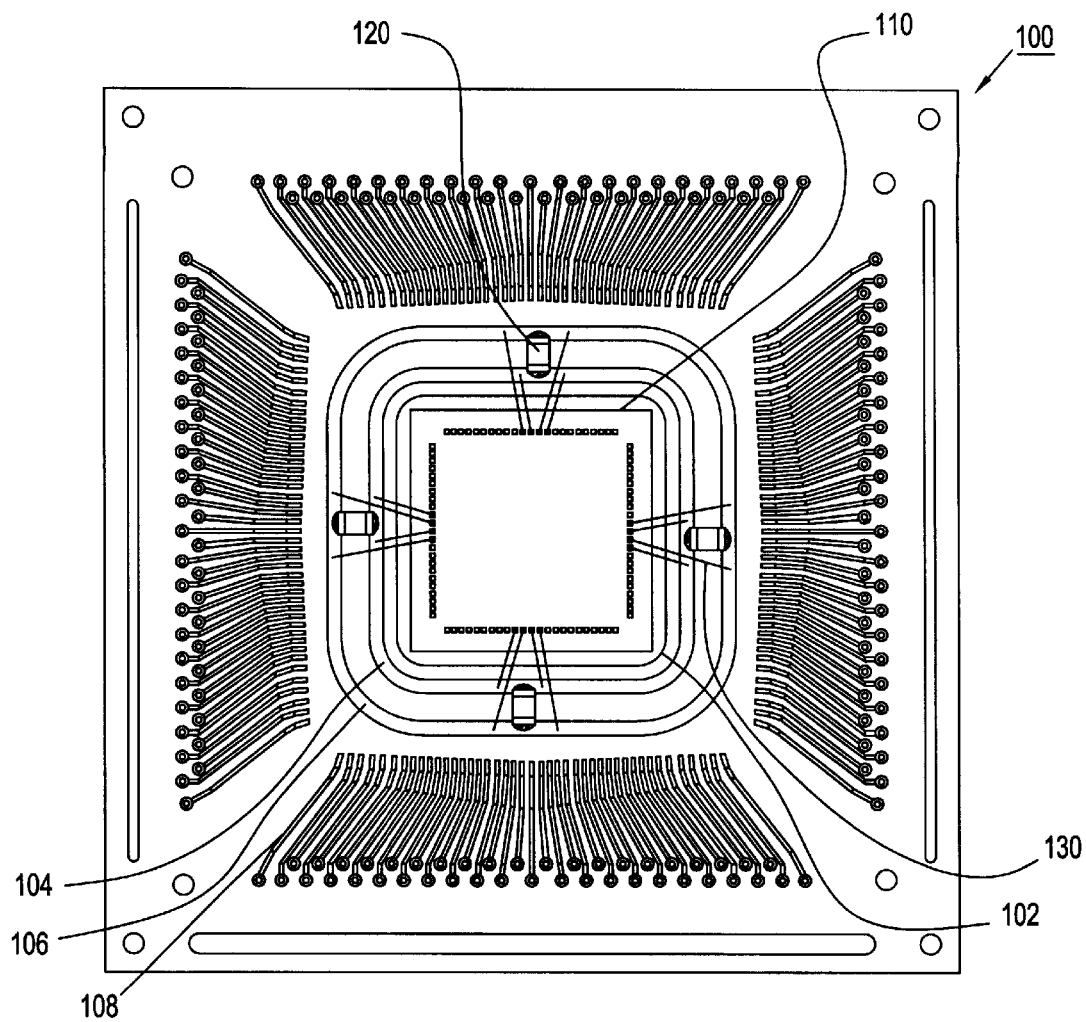
FIG. 1 is a top plan view of a conventional electronic package illustrating several decoupling capacitors connected across ground ring and power ring of a substrate wherein the package body has been removed.
Figure 2:
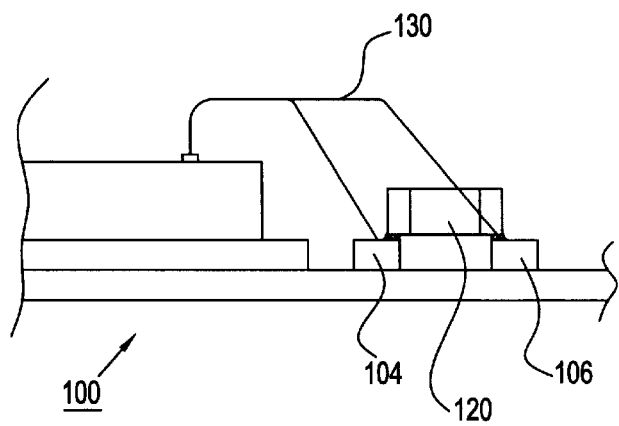
FIG. 2 is a cross sectional view of a portion of the conventional electronic package of FIG. 1 wherein the package body has been removed.

Referring to FIG. 1 and FIG. 3, since the bonding wires predetermined to be connected between the chip 110 and the ground ring 104 (or the power ring 106) at the periphery of the surface-mountable device don't have to keep away from the surface-mountable device, each of the bonding wires is bonded to be approximately orthogonal to one side of the chip 110, thereby significantly reducing difficulties and risks of wire bonding operation. Further, the electronic package of the present invention allows the surface-mountable device to be placed at optimum location for best electrical performance without introducing additional problems into the wire bonding operation of wires nearby.

Although the invention has been explained in relation to its preferred embodiment, it is to be understood that many other possible modifications and variations can be made without departing from the spirit and scope of the invention as hereinafter claimed.

What is claimed is:

1. An electronic package comprising:

a substrate having opposing upper and lower surfaces, the upper surface of the substrate being provided with a ground ring, a power ring, and a plurality of conductive traces arranged at the periphery of the ground ring and the power ring;

at least a surface-mountable device connected across the ground ring and the power ring, the surface-mountable device comprising two end contacts and at least a bonding region formed on one of the end contacts;

a chip disposed on the upper surface of the substrate, the chip having a plurality of bonding pads located about the periphery thereof; and at least a first bonding wire having one end connected to one of the bonding pads of the chip and the other end connected to the bonding region of the surface-mountable device.

2. The electronic package as claimed in claim 1, wherein the bonding region of the surface-mountable device comprises a layer of metal selected from the group consisting of gold and palladium covering the end contact of the surface-mountable device.

3. The electronic package as claimed in claim 1, wherein the bonding region of the surface-mountable device comprises a layer of nickel covering the end contact of the surface-mountable device, and a layer of metal selected from the group consisting of gold and palladium covering the nickel layer.

4. The electronic package as claimed in claim 1, wherein the bonding region of the surface-mountable device comprises a layer of nickel covering the end contact of the surface-mountable device, a layer of palladium covering the nickel layer, and a layer of gold covering the palladium layer.

5. The electronic package as claimed in claim 1, wherein the surface-mountable device is a capacitor.

6. The electronic package as claimed in claim 1, further comprising a plurality of second bonding wires electrically connecting the bonding pads of the chip to the power ring, the ground ring and corresponding conductive traces of the substrate, respectively.

* * * * *